United States Patent [19]
Creighton et al.

[11] Patent Number: 5,663,098
[45] Date of Patent: Sep. 2, 1997

[54] METHOD FOR DEPOSITION OF A CONDUCTOR IN INTEGRATED CIRCUITS

[75] Inventors: J. Randall Creighton; Frank Dominguez; A. Wayne Johnson; Thomas R. Omstead, all of Albuquerque, N. Mex.

[73] Assignee: Sandia Corporation, Albuquerque, N. Mex.

[21] Appl. No.: 258,911

[22] Filed: Jun. 13, 1994

Related U.S. Application Data

[63] Continuation of Ser. No. 958,385, Oct. 8, 1992, abandoned.
[51] Int. Cl.$^6$ ............................................. H01L 21/28
[52] U.S. Cl. ........................ 438/675; 438/680; 438/703
[58] Field of Search .................................... 437/187, 189, 437/192, 245; 156/646.1

[56] References Cited

U.S. PATENT DOCUMENTS

| | | | |
|---|---|---|---|
| 4,532,702 | 8/1985 | Gigante et al. | 437/246 |
| 4,617,087 | 10/1986 | Iyer et al. | 156/643 |
| 4,804,560 | 2/1989 | Shioya et al. | 427/125 |
| 5,037,775 | 8/1991 | Reisman | 437/192 |
| 5,100,501 | 3/1992 | Blumenthal et al. | 437/245 |
| 5,164,330 | 11/1992 | Davis et al. | 437/192 |
| 5,201,995 | 4/1993 | Reisman | 437/245 |
| 5,326,723 | 7/1994 | Petro et al. | 432/192 |

FOREIGN PATENT DOCUMENTS 0333084  9/1989  European Pat. Off. .

OTHER PUBLICATIONS

Progress in LPCVD Tungsten for Advanced Microelectronics, Applications Solid State Technology, Nov. 1986, vol. 29, No. 11.
Selective Tungsten on Silicon by the Alternating Cyclic, AC, Hydrogen Reduction of $WF_6$, The Electrochemical Society, Inc., Feb. 1990, vol. 137, No. 2.

*Primary Examiner*—John Niebling
*Assistant Examiner*—Thomas G. Bilodeau
*Attorney, Agent, or Firm*—Timothy D. Stanley; Brian Dodson; Gregory A. Cone

[57] ABSTRACT

A method is described for fabricating integrated semiconductor circuits and, more particularly, for the selective deposition of a conductor onto a substrate employing a chemical vapor deposition process. By way of example, tungsten can be selectively deposited onto a silicon substrate. At the onset of loss of selectivity of deposition of tungsten onto the silicon substrate, the deposition process is interrupted and unwanted tungsten which has deposited on a mask layer with the silicon substrate can be removed employing a halogen etchant. Thereafter, a plurality of deposition/etch back cycles can be carried out to achieve a predetermined thickness of tungsten.

6 Claims, 1 Drawing Sheet

METHOD FOR DEPOSITION OF A CONDUCTOR IN INTEGRATED CIRCUITS

This is a continuation of application(s) Ser. No. 07/958,385; filed Oct. 8, 1992, abandoned.

The United States Government has rights in this invention pursuant to Contract No. DE-AC04-76DP00789 between the Department of Energy and American Telephone and Telegraph Company.

BACKGROUND OF THE INVENTION

The present invention relates generally to a method for fabricating semiconductor devices and, more particularly, for the selective deposition of a conductor onto a substrate for forming integrated semiconductor circuits.

A variety of fabrication techniques have been developed for deposition of conductors onto substrates to form electrodes, wiring and the like in integrated semiconductor circuits. Because of the compatibility of refractory metals and silicon substrates in integrated circuits, chemical vapor deposition (CVD) of refractory metals and their silicides onto silicon substrates has enjoyed broad interest within the microelectronics industry. However, such interest has been constrained in commercial applications because of limitations in the CVD process as presently practiced.

Selective CVD processes were developed for the deposition of conductors onto a semiconductor substrate as discussed by R. Blower, "Advanced Microelectronics Applications" *Solid State Technology*, pp.117–126, November 1986. More refined CVD processes have been developed by A. Reisman et al, "Selective Tungsten on Silicon by the Alternating Cyclic, AC, Hydrogen Reduction of WF6" *J. Electrochem. Soc.* Vol. 137, pp. 772–727, February 1990 as well as; Shioya et al U.S. Pat. No. 4,804,560 and Iyer et al U.S. Pat. No. 4,617,087.

Typically, selective deposition processes employ chemical vapor deposition to selectively deposit a conductor onto a substrate of an integrated semiconductor circuit. For example, the surface of a silicon semiconductor can be coated with a mask layer having apertures patterned therein so as to form openings in which a refractory metal can be deposited. The silicon semiconductor with mask layer can then be loaded into CVD apparatus. A conductor source gas, such as WF6, and H2 are fed into the CVD apparatus; the gas pressure is reduced to less than 1 Torr; the semiconductor substrate is heated in the range of 300° to 600° C.; and chemical reactions occur generally in accordance with the following relationships:

2 WF6+3 Si=2W+3SiF4     (1)

WF6+3H2=W+6HF     (2)

The mask layer is non reactive in reaction (1) and is typically a material such as SiO2 or phosphosilicate glass (PSG). As such, reaction (1) can be thought of as selectively depositing tungsten only on the exposed silicon substrate. However, reaction (1) is self-limiting once a deposition thickness of ~100 Angstroms has been deposited onto the silicon substrate. Thereafter, reaction (2) continues to deposit tungsten on the previously deposited tungsten. Since hydrogen dissociates preferentially on metals and silicides and not on SiO2, reaction (2) tends to be selective and can achieve tungsten layers of 500 to 1500 Angstroms thick before the onset of deposition of tungsten on the mask layer itself. At which point, the process ceases to be selective and tungsten is now deposited onto both the mask layer as well as the previously deposited tungsten. This loss of selectivity has been a major constraint in the commercialization of such processes and has been the focus of the efforts previously described by Reisman, Iyer and Shioya. Reisman, Iyer and Shioya each provide different approaches to removing the unwanted deposition of tungsten from the mask layer. In particular, Shioya employs either gaseous or liquid HF as the etchant; Iyer employs a plasma etching procedure using NF3 as the etchant, which occurs simultaneously with the deposition process; and Reisman uses the conductor source gas itself, WF6, as the etchant. Nevertheless, the need for a commercial CVD selective deposition process remains largely unsatisfied.

SUMMARY OF THE INVENTION

The present invention relates generally to a method for fabricating semiconductor devices and, more particularly, to a method for the selective deposition of a conductor onto a substrate to form integrated semiconductor circuits.

In a CVD process, a conductor can be selectively deposited onto a portion of a substrate exposed to a conductor source gas through apertures in a mask layer with the semiconductor substrate. After a predetermined time, the selective deposition process can be interrupted and a halogen etchant gas can be introduced to remove undesired deposition of the conductor from the mask layer. Thereafter, repetitions of the selective deposition and etching steps can be carried out to achieve predetermined deposition thicknesses of the conductor. In particular, selective depositions of refractory metals and their silicides onto semiconductors, metals and diffusion barriers can be achieved using both cold wall and hot wall CVD apparatus. Additionally, the present invention has been found to achieve significant results when the etchant gas is a mixture of fluorine and an inert gas. These and other advantages of the present invention will be discussed more completely below.

BRIEF DESCRIPTION OF THE DRAWINGS

The accompanying drawings, which are incorporated in and form part of the specification, illustrate the present invention and, together with the description, serve to explain the invention.

DETAILED DESCRIPTION OF THE INVENTION

Figure 1:
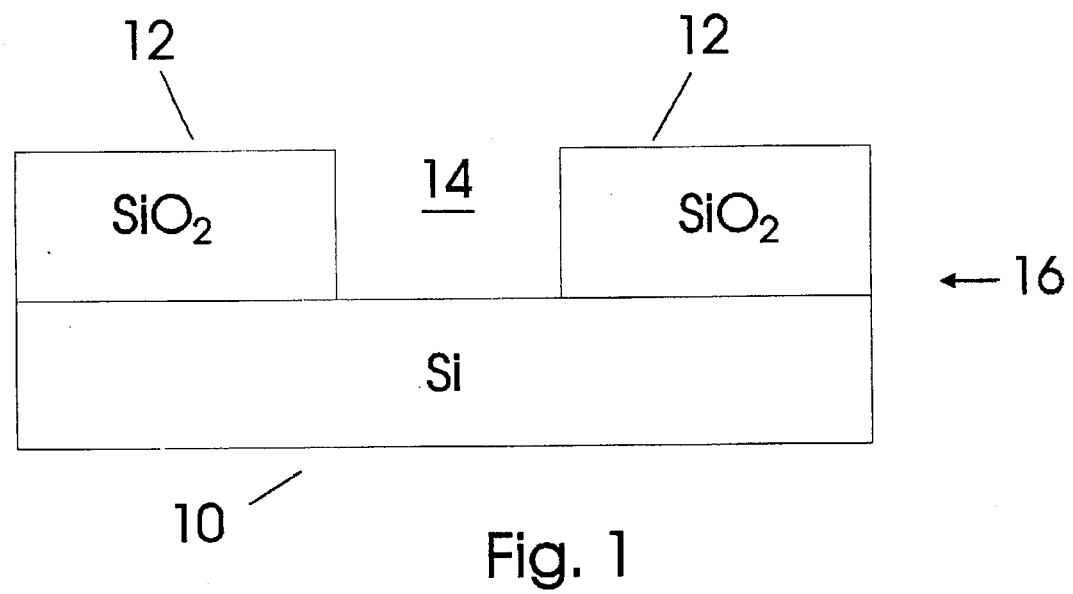
FIG. 1 is a schematic representation of a cross-section of a semiconductor substrate having an apertured mask layer thereon.
Figure 2:
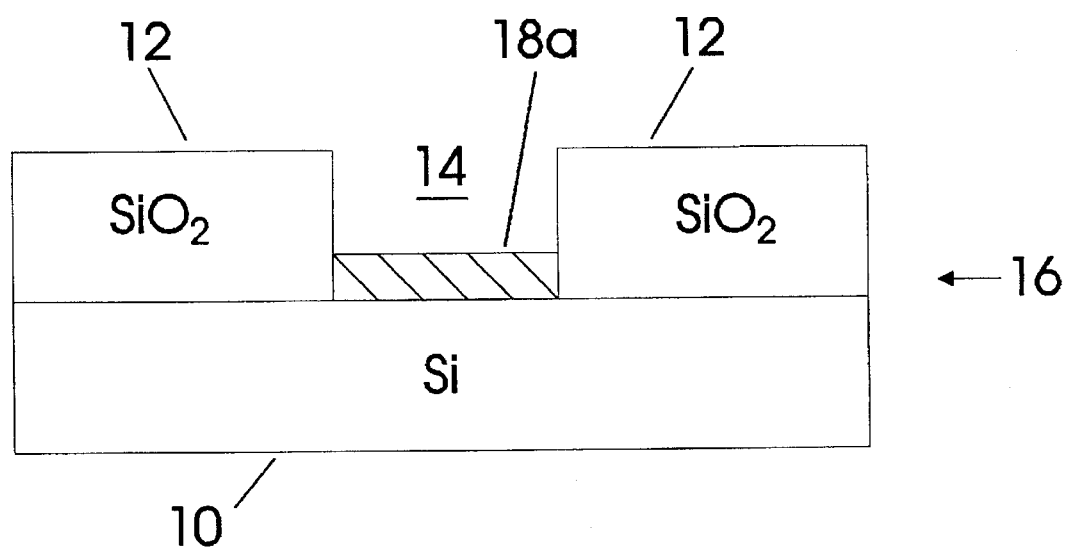
FIG. 2 is a schematic representation of the semiconductor substrate of FIG. 1 having a conductor selectively deposited thereon according to the present invention.

In order to better understand the present invention, the following introductory discussion is provided with reference to FIGS. 1 and 2. Selective CVD of refractory metals (e.g., W, Ti, Mo) and their silicides onto substrates is typically undertaken employing the following preparatory steps. Those skilled in the art will appreciate that such substrates can include semiconductors, metals and diffusion barriers (e.g.,TiN and TiW). For simplicity, the following discussion will be limited to the use of silicon semiconductor substrates.

Looking first to FIG. 1, a mask layer 12 is coated onto a surface of a silicon semiconductor substrate 10. The mask layer 12 is generally made of PSG or SiO2 and is approximately 1 micron thick. Apertures 14 can be formed in the mask layer 12 using known lithographic techniques. As a result, a portion of the silicon substrate 10 is exposed at the bottom of aperture 14. Thereafter, an assembly 16 comprising the mask layer 12 and silicon substrate 10 can be loaded in a CVD apparatus. Such CVD apparatuses can include both hot wall and cold wall devices.

Assembly 16 can then be processed in the CVD apparatus according to the following range of deposition conditions: flowing 1 to 600 sccm WF6 and 1 to 30,000 sccm H2 along with an inert gas such as helium or argon at temperatures ranging from 200° to 500° C. and pressures ranging from 1 to 10,000 mTorr. Additionally, silane (SiH4) can be used in place of or in addition to H2 in reaction(1). As will be further discussed below, two examples of the deposition/etch back process of the present invention are given below.

The deposition of a refractory metal ( such as tungsten, titanium etc.) onto the silicon substrate 10 in the CVD apparatus takes place in accordance with the relationships set forth in (1 and 2). Initially, deposition of tungsten occurs in accordance with reaction (1) and continues until a layer of ~100 Angstroms has been deposited onto the exposed silicon substrate 10. Thereafter, tungsten can continue to be deposited on the recently deposited layer in accordance with reaction (2). Generally, such deposition can last from 30 seconds to 5 minutes. A first layer 18a of deposited tungsten formed on the silicon substrate 10 in aperture 14 is depicted in FIG. 2. Additionally, nuclei of tungsten (not shown) can also deposit on the exposed surface of mask layer 12.

The deposition of tungsten onto mask layer 12 is unwanted and undesirable. Consequently, it is desirable to interrupt the CVD deposition process at the onset of deposition of tungsten onto the mask layer. This point in time is generally referred to in the art as the onset of loss of selectivity (LOS). The tungsten layer 18a can now be about 500 to 1500 Angstroms thick. As FIG. 2 depicts, this thickness of tungsten is not sufficient to fill aperture 14. Consequently, further depositions of tungsten are required. However, before such further depositions can occur, the tungsten deposited on the mask layer should be substantially removed.

Since the deposition of tungsten on the mask layer 12 is undesirable for a variety of reasons, an etch back process can be initiated whereby the unwanted tungsten on mask layer 12 can be removed. Unfortunately, the etch back process can also remove a portion of the selectively deposited layer 18a as well as the mask layer 12 itself, neither of which is desirable. Therefore, control of the etch back process is needed so as to minimize removal of tungsten layer 18a yet be effective to clean the exposed surface of mask layer 12 of unwanted tungsten nuclei.

In one embodiment of the present invention, the conductor source gas (e.g. WF6) and the byproducts of reactions (1 and 2) can be purged from the CVD apparatus prior to initiating the etch back process. The purge step is done as a precautionary safety matter; however, it is not a necessary step. The etch back process includes introducing a halogen and an inert gas into the CVD apparatus under the following range of conditions: flowing a mixture of halogen and an inert gas of from 0.25 to 100%, by volume, halogen at temperatures from 200° to 500° C. and pressures from 1 to 10,000 m Torr.

An important aspect in the use of halogens as etchants is to minimize removal of the mask layer 12 as well as the recently deposited layer of tungsten 18a. While both fluorine and chlorine have been evaluated, the use of fluorine is preferred for thermal etching processes while the use of other fluoroamines, e.g., $NF_3$, have been found effective in plasma etching processes. In contrast, the use of other etchants such as HF and WF6 were found to be either ineffective in removing unwanted depositions of tungsten from the mask layer 12 or resulted in excessive removal of both the deposited layer of tungsten and the mask layer material itself. Moreover for the etch back step to be commercially attractive, it should be capable of etch rates which allow repetitions of the deposition and etch steps in commercially reasonable times.

Upon completion of the etch back step and prior to initiating a subsequent deposition step, the CVD apparatus can be purged of the etchant gas and the byproducts of its reaction. The minimum etch time was determined to be ~15 seconds.

Hereafter, a combination of a deposition step followed by an etch back step will be referred to as a deposition/etch back cycle. Recalling from FIG. 2 that the layer 18a of the first deposition/etch back cycle did not fill aperture 14, a plurality of additional deposition/etch back cycles can be carried out to deposit additional layers of tungsten $18_i$ (not shown) to achieve a desired thickness. Each deposition/etch back cycle includes deposition, purge of conductor source gas and by products, etch back, and purge of etch gas and by products. It was found that subsequent deposition/etch cycles can be terminated on either a etch step or a shortened deposition step. To minimize the number of deposition/etch cycles needed to achieve a desired thickness of conductor on the substrate, it is necessary to maximize the deposition of conductor before the onset of LOS. When integrating the deposition and etch cycles, the beginning and end cycles are always different from the rest of the cycles. The first deposition cycle is generally kept shorter than subsequent deposition cycles. Similarly, the first etch cycle is generally shorter than subsequent etch cycles. A variety of deposition/ etch cycle times can be used in combination to achieve a specified thickness. Normalized deposition rates (total thickness)/(deposition+etch time) over the course of several deposition/etch back cycles have been found to be in the range of 500 to 1250 A/minute. Moreover, the ratio of the duration of the deposition step to the etch step in each deposition/etch back cycle should be greater than one and preferably equal to or greater than two.

These and other benefits of the present invention will become apparent to those skilled in the art from a reading of this disclosure and the present invention is to be limited only they the claims appended hereto.

We claim:

1. A method for the chemical vapor deposition of a conductor onto at least one region of a substrate, comprising
   a. defining said region by deposition of an apertured mask layer, said apertured mask layer comprising a material such that the initial deposition rate of said conductor on the apertured mask layer is slower than the initial deposition rate on said substrate;
   b. depositing said conductor onto the composite structure comprising the substrate and apertured mask layer;
   c. interrupting the deposition rate of said conductor onto said composite structure and restoring the difference in rate of deposition of the conductor on the substrate over the rate of deposition of conductor on the apertured mask layer;
   d. selectively removing the conductor from the apertured mask layer with a halogen etchant and inert gas mixture which contains from 0.25 to 100% by volume fluorine, and restoring the difference in rate of deposition of the conductor on the substrate over the rate of deposition of conductor on the apertured mask layer; and e. repeating steps (b–d) to deposit said conductor on said regions of substrate.

2. A method for the chemical vapor deposition of a conductor onto at least one region of a substrate, comprising:

a. defining said region by deposition of an apertured mask layer, said apertured mask layer comprising a material such that the initial deposition rate of said conductor on the apertured mask layer is slower than the initial deposition rate on said substrate;

b. depositing said conductor onto the composite structure comprising the substrate and apertured mask layer;

c. interrupting the deposition rate of said conductor onto said composite structure; and p1 d. selectively removing the conductor from the apertured mask layer with an etchant made from the mixture of an inert gas and a halogen-containing material selected from $F_2$, $Cl_2$, fluoroamines, and restoring the difference in rate of deposition of the conductor on the substrate over the rate of deposition of conductor on the apertured mask layer.

3. A method for the chemical vapor deposition of a conductor onto at least one region of a substrate, comprising:

a. defining said region by deposition of an apertured mask layer, said apertured mask layer comprising a material such that the initial deposition rate of said conductor on the apertured mask layer is slower than the initial deposition rate on said substrate;

b. depositing said conductor onto the composite structure comprising the substrate and the apertured mask layer;

c. interrupting the deposition of said conductor onto said composite structure by substantially purging a conductor source gas from the vicinity of the substrate; and d. selectively removing the conductor from the apertured mask layer with a halogen etchant and restoring the difference in rate of deposition of the conductor on the substrate over the rate of deposition of conductor on the apertured mask layer.

4. The method of claim 3, wherein the halogen etchant is a halogen selected from $F_2$, $Cl_2$ and fluoroamines, in an inert carrier gas.

5. The method of claim 3, wherein the halogen etchant comprises a mixture of from 0.25 to 100%, by volume, fluorine, in an inert carrier gas.

6. The method of claim 3 wherein the step of interrupting the deposition of said conductor onto said composite structure comprises substantially purging the source gas from the vicinity of the semiconductor substrate.

* * * * *